United States Patent
Takeoka et al.

(10) Patent No.: US 6,716,927 B2
(45) Date of Patent: Apr. 6, 2004

(54) PEROVSKITE-TYPE ORGANIC/INORGANIC LAMELLAR POLYMER

(75) Inventors: Yuko Takeoka, Kanagawa (JP); Keisuke Asai, Tokyo (JP)

(73) Assignee: Japan Science and Technology Agency, Tokyo (JP)

(*) Notice: Subject to any disclaimer, the term of this patent is extended or adjusted under 35 U.S.C. 154(b) by 0 days.

(21) Appl. No.: 10/182,611

(22) PCT Filed: Nov. 19, 2001

(86) PCT No.: PCT/JP01/10090
§ 371 (c)(1),
(2), (4) Date: Jul. 29, 2002

(87) PCT Pub. No.: WO02/48219
PCT Pub. Date: Jun. 20, 2002

(65) Prior Publication Data
US 2003/0096902 A1 May 22, 2003

(30) Foreign Application Priority Data
Dec. 15, 2000 (JP) ......... 2000-382274
Feb. 14, 2001 (JP) ......... 2001-036429

(51) Int. Cl.[7] ......... C08F 275/00; C08L 51/00; C07F 15/00; C08J 3/28
(52) U.S. Cl. ......... 525/274; 522/137; 524/534; 525/245; 525/269; 525/275; 556/45; 556/51; 556/110; 556/118; 556/137; 556/138; 534/15
(58) Field of Search ......... 525/245, 274, 525/269, 275; 524/534; 556/51, 45, 110, 118, 137, 138; 522/133; 534/15

(56) References Cited

U.S. PATENT DOCUMENTS

2002/0124790 A1   9/2002   Masano ......... 117/1

FOREIGN PATENT DOCUMENTS

| JP | 4-83787 | * 3/1992 | |
|---|---|---|---|
| JP | 11-80181 | * 3/1999 | |
| JP | 11-322845 | 11/1999 | ......... C08F/12/22 |
| JP | 2000-191925 | 7/2000 | ......... C08L/101/02 |
| JP | 2002-80839 | * 3/2002 | |
| WO | WO 97/44712 | 11/1997 | ......... G03F/7/004 |

OTHER PUBLICATIONS

Basace, et al., Delpine Reaction of Acetylenic Compounds, Bull. Soc. Chim. Fr., 1971, 4, pp. 1468–1472 (translation included).

Besace, et al., Synthesis of Primary [2;4–Alkadiyn–1–Ylamides] by the Delpine Reaction, C. R. Acad. Sci., Ser. C, 1970, 270(19), pp. 1605–1607 (translation included).

* cited by examiner

Primary Examiner—Porfirio Nazario-Gonzalez
(74) Attorney, Agent, or Firm—Gary C Cohn PLLC

(57) ABSTRACT

Amines having an unsaturated bond can be introduced into the organic layer of organic-inorganic laminar perovskite compounds comprising a metal halide and an organic amine, and the organic layer can be polymerized by applying external energy such as by irradiating with UV light or radiation. In this way, the quantum well structure is stabilized. The organic-inorganic laminar perovskite polymer compound is produced by cross-linking unsaturated bonds of an organic-inorganic laminar perovskite compound represented by the general formula $(RNH_3)_2MX_4$ (in the formula, R is a hydrocarbon group having an unsaturated bond, X is a halogen or mixture of same, M is Group IVa metal, Eu, Cd, Cu, Fe, Mn or Pd). R is represented by $CH_3(CH_2)_nC{\equiv}C{-}C{\equiv}CCH_2$ (n=2–14). It is preferred that M is Pb, and X is a bromine atom.

7 Claims, 6 Drawing Sheets

PEROVSKITE-TYPE ORGANIC/INORGANIC LAMELLAR POLYMER

TECHNICAL FIELD OF THE INVENTION

This invention relates to an organic-inorganic perovskite polymer compound having excellent photoemission characteristics and non-linear characteristics, and which can be applied to EL elements or time-space transformation elements.

More specifically, this invention relates to an organic-inorganic laminar polymer compound represented by the general formula $A_2MX_4$ where A is an organic ammonia molecule, M is a group IV element or transition metal, and X is a halogen, the compound having a structure stabilized by polymerizing the organic layer of the organic ammonia-inorganic halide laminar perovskite compound forming a super lattice structure (FIG. 1) wherein the organic ammonia molecule A layer and inorganic halide $MX_4$ layer are laminated alternately.

PRIOR ART

The laminar perovskite compound represented by the general formula $(RNH_3)_2MX_4$, as shown in FIG. 1, has a self-ordered quantum well structure wherein an inorganic semiconductor layer (halogenated metal ($MX_4^{2-}$)) and organic ammonium $RNH_3$ dielectric layer are connected two-dimensionally by sharing the apex of a halogenated metal $MX_6$ of octahedral structure. The bandgap of this organic dielectric layer is much larger than that of the inorganic semiconductor layer, so an electron is enclosed in the inorganic semiconductor layer. This electron is enclosed on the inorganic semiconductor layer two-dimensional surface (the structure is referred to as a "quantum well structure"). Due to this quantum well structure, this compound exhibits very intense photoemission characteristics and third-order non-linear optical characteristics.

The reason why $(PbX)_4^{2-}$ is taken as the inorganic semiconductor layer $(PbX_4)$ is because, due to this low dimensional semiconductor structure, a stable exciton is formed having a flux energy as large as several hundred meV, so it has very interesting exciton characteristics such as a strong exciton absorption and photoemission even at room temperature. It has also been found that it has a large third-order non-linear light sensitivity factor of the order of $10^{-5}$ esu, so optical material applications such as electroluminescence or optically excited laser emissions may be expected.

In particular, $(C_nH_{2n+1}NH_3)_2PbI_4$ is the substance with the most remarkable exciton effect.

However, as these laminar perovskite compounds had a low stability with respect to light, heat and humidity, there were problems in their application. This instability is thought to be due to dissociation of halogen and fluctuation of amines in the organic layer induced by light.

PROBLEMS TO BE SOLVED BY THE INVENTION

It is therefore an object of this invention to increase the stability of the quantum well structure of laminar perovskite compounds having excellent optical characteristics and possible applications in light emitting elements.

Specifically, it is known that compounds having unsaturated bonds such diacetylene, due to their regular arrangement, are polymerized by applying external energy such as UV light or radiation. The organic amines in laminar perovskite compounds are oriented substantially perpendicular to the inorganic layer due to halogen ions in the inorganic layer, hydrogen bonds and Van der Waals forces. These have a regular arrangement due to the arrangement of metal. On the other hand, perovskite compounds have a high radiation resistance. Hence, by introducing unsaturated bonds such as double bonds or triple bonds into the organic layer and irradiating with a radiation, solid polymerization can occur in a regular structural state. In this way it is thought that, by polymerizing laminar perovskite compounds, fluctuations in the organic layer can be decreased.

MEANS TO SOLVE THE PROBLEMS

In this invention, it was discovered that amines having unsaturated bonds can be introduced into the organic layer of organic-inorganic laminar perovskite compounds comprising a metal halide and an organic amine, and the organic layer is polymerized by applying external energy such as by irradiating with UV light or radiation. In this way, the quantum well structure is stabilized.

Specifically, in the following examples, it was evident that by introducing lead bromide, $PbBr_2$, which might be expected to increase stability, into the inorganic layer, and an amine having an unsaturated bond such as a diacetylene bond or the like into the organic layer, and polymerizing these species, a highly stable organic-inorganic laminar perovskite compound can be obtained.

Further, by using this method, it is also possible to construct an organic-inorganic superlattice wherein the organic layer is not a simple obstacle, but is an active blocking layer having a conjugated structure into which functionality has been introduced.

This invention is also an organic-inorganic laminar perovskite polymer compound produced by cross-linking unsaturated bonds of an organic-inorganic laminar perovskite compound represented by the general formula $(RNH_3)_2MX_4$.

In the formula, R is a hydrocarbon group having an unsaturated bond. This unsaturated bond may be either a double bond or triple bond, but a triple bond permits easier polymerization. Also, there is no particular limitation on the number of unsaturated bonds. There is no particular limitation on the number of carbon atoms in R, but it is preferable that the number of carbon atoms is suitable for polymerization, specifically of the order of 2–20. R may be straight chain or branched, but straight chain is preferable from the viewpoint of ease of polymerization. An example of R is the hydrocarbon group represented by $CH_3(CH_2)_nC\equiv C-C\equiv CCH_2$ (preferably, n=2–14). M is a Group IVa metal, Eu, Cd, Cu, Fe, Mn or Pd, preferably a Group IVa metal or Eu, more preferably a Group IVa metal, still more preferably Ge, Sn or Pb and most preferably Pb. X is a halogen atom, preferably Cl, Br or I, and most preferably Br. X may also be a mixture of halogens.

The method of cross-linking the organic layer, and particularly the method of cross-linking the unsaturated bonds contained in the organic layer, may be any method known in the art, but irradiation with ultraviolet light or radiation is convenient and preferred. The degree to which these unsaturated bonds should be cross-linked differs depending on the application and the molecular structure comprising the unsaturated bonds, and therefore is determined according to the case. It is not absolutely necessary to perform cross-linking until all the unsaturated bonds have been completely eliminated, and provided polymerization is continued until a target fluctuation has decreased to a predetermined degree, it may be considered that this purpose has been achieved. The polymerization conditions are a matter to be designed by the polymerization technician.

The organic-inorganic laminar perovskite polymer compound of this invention has excellent photoemission characteristics and non-linear characteristics, so its application is expected in EL elements or time-space transformation elements which demand these characteristics, and studies have already been performed on applications to EL elements or the like. It may be expected that these applications will be enhanced by this invention.

These polymers not only stabilize the organic layer, but also offer the possibility of forming a novel superlattice. For example, if diacetylene is polymerized it becomes polydiacetylene, and as polydiacetylene is a semiconductor, a quantum well structure different from an organic layer comprising an insulator can be manufactured. Further, as the organic layer also exhibits semiconductor characteristics, there is thought to be an interaction with the inorganic layer so that a novel superlattice structure is formed. This superlattice structure is an interesting structure which is expected to improve third- order non-linear optical characteristics. This invention will not only accelerate research on low dimensional exciton physics, but will also provide an important technique for developing new optically functional devices.

Hereafter, this invention will be described by way of specific examples, but it is to be understood that it is not to be construed as being limited thereby.

EXAMPLE 1

A laminar perovskite compound, $(CH_3(CH_2)_2C{\equiv}C{-}C{\equiv}CCH_2NH_3)_2PbBr_4$, in which an organic layer comprising an amine and having a diacetylene bond was synthesized by reacting lead bromide $PbBr_2$ as metal halide with $(CH_3(CH_2)_2C{\equiv}C{-}C{\equiv}CCH_2NH_3Br$ as an organic amine halogenated hydroacid in a molar ratio of 1:2 in N,N-dimethylformamide ($HCON(CH_3)_2$).

Figure 1:
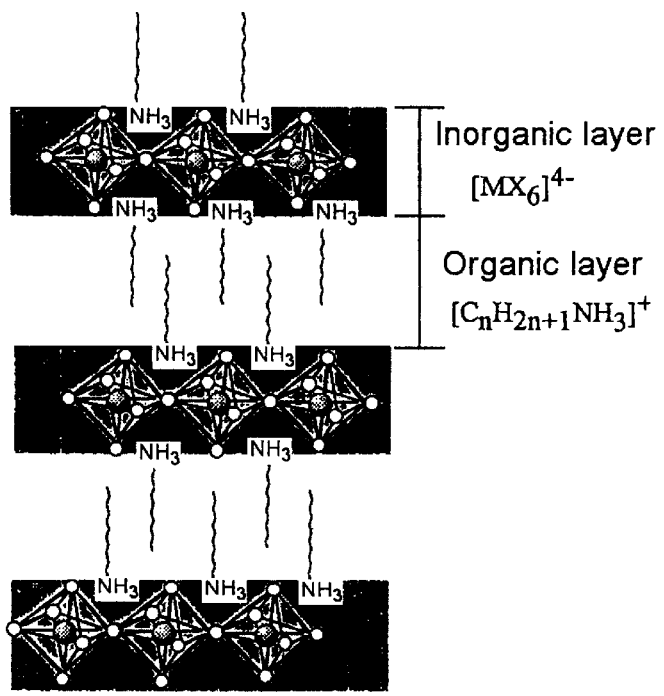
FIG. 1 is a schematic view of a laminar structure and organic-inorganic perovskite compound (low dimensional quantum well structure).
Figure 2:
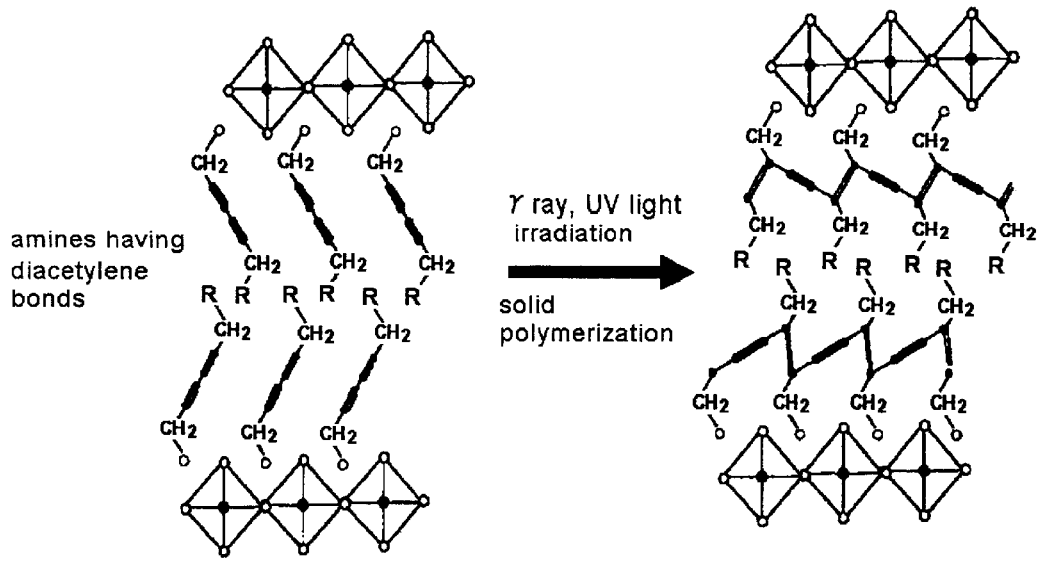
FIG. 2 is a schematic view showing the procedure of introducing diacetylene bonds into the organic layer of an organic-inorganic perovskite, and polymerizing by irradiating with UV light or gamma radiation.

This laminar perovskite compound $CH_3(CH_2)_2C{\equiv}C{-}C{\equiv}CCH_2NH_3)_2PbBr_4$ was dissolved in the organic solvent N,N'-dimethylformamide, and spin-coated on a quartz substrate to give a sample thin film. The sample thin film was irradiated with UV light of 254 nm for 30–350 minutes to perform polymerization. The type of polymerization obtained in the organic ammonium layer in this organic-inorganic laminar perovskite compound is shown in FIG. 2.

Figure 3:
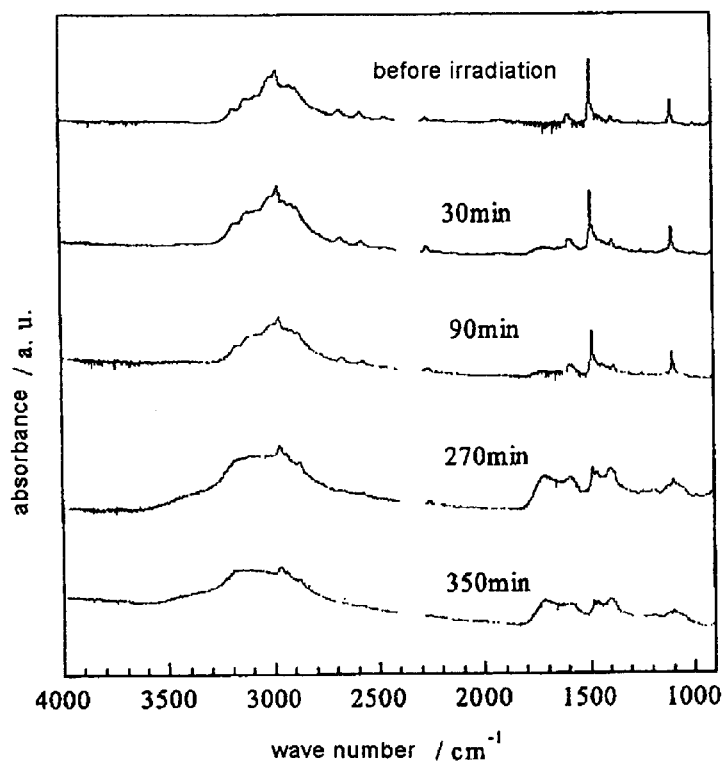
FIG. 3 shows the variation in the FT-IR spectrum of a spin coat film of $(CH_3(CH_2)_2C{\equiv}C{-}C{\equiv}CCH_2NH_3)_2PbBr_4$ relative to UV light irradiation amount. To standardize the degree of absorption, the figures in brackets show how many times the degree of light absorption must be increased to achieve the highest intensity (idem in FIGS. 4–7).
Figure 4:
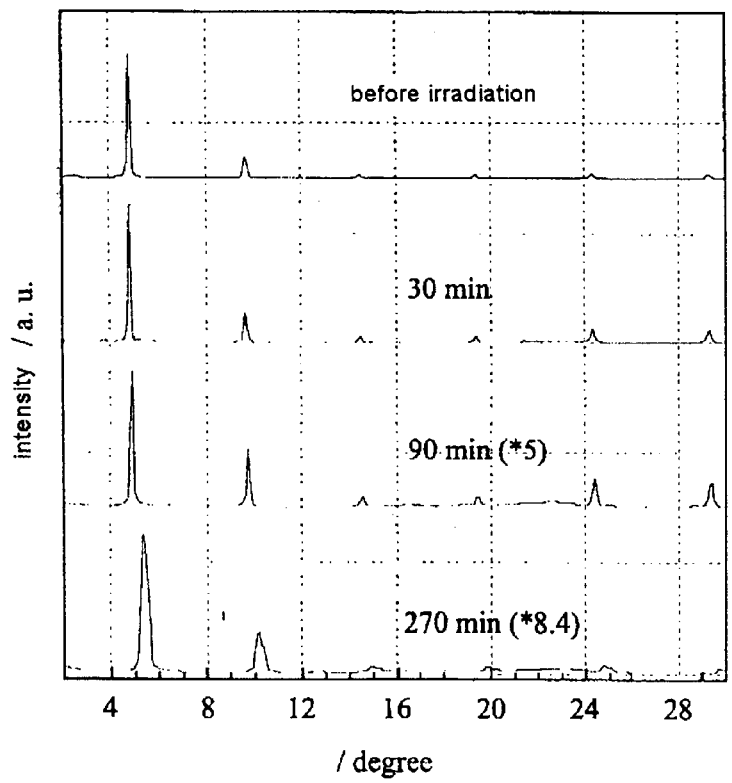
FIG. 4 shows the variation in X-ray diffraction of a spin coat film of $(CH_3(CH_2)_2C{\equiv}C{-}C{\equiv}CCH_2NH_3)_2PbBr_4$ relative to UV light irradiation amount.
Figure 5:
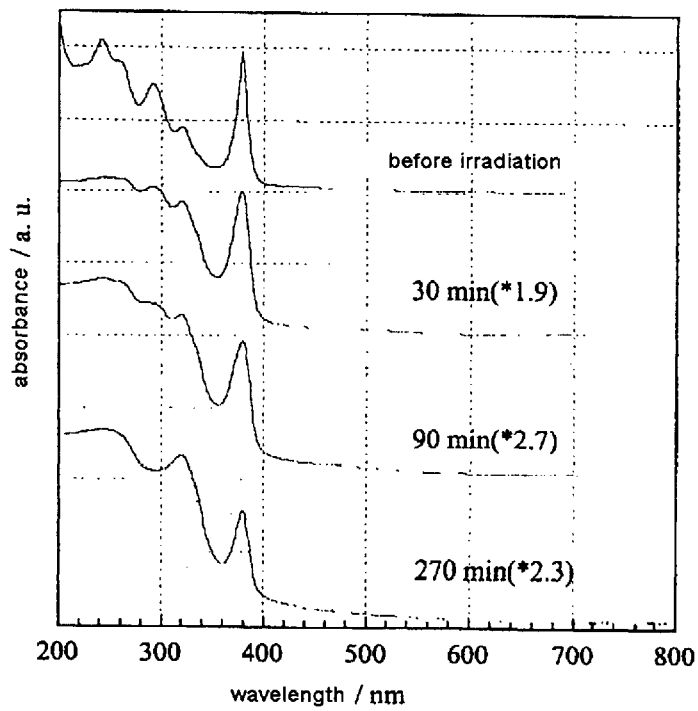
FIG. 5 shows the variation of the absorption spectrum of a spin coat film of $(CH_3(CH_2)_2C{\equiv}C{-}C{\equiv}CCH_2NH_3)_2PbBr_4$ relative to UV light irradiation amount.

FIGS. 3–5 show the Fourier IR spectrum variation (FIG. 3) due to increase of irradiation amount with UV irradiation time, X-ray diffraction (FIG. 4), and absorption in the visible UV (FIG. 5).

In FIG. 3, as a result of FT-IR measurement after UV irradiation, a new peak due to the main chain of polydiacetylene was observed at 1650 cm$^{-1}$, showing that polymerization had taken place. Further, the precise degree to which polymerization proceeds in this irradiation amount range is not clear, but it may be conjectured, due to the variation in the IR absorption spectrum (FT-IR) of FIG. 3, that most of the acetylene is polymerized.

In FIG. 4, a shift of the peaks to higher incidence angles is observed as the irradiation time increases. This is because, as the interlayer distance decreases due to irradiation, a polymerization reaction occurs in the laminar perovskite compound, polymerization of the organic layer takes place and a new laminar structure is obtained.

Finally, in FIG. 5, it is seen that the exciton absorption (380 nm) is maintained even after polymerization. The 380 nm peak corresponds to absorption due to excitons formed in the aforesaid quantum well, and the fact that this absorption is observed shows that the quantum well structure is maintained even after polymerization.

EXAMPLE 2

A thin film sample was manufactured and irradiation was performed at an irradiation amount of 8–37 Mrad as in Example 1, except that instead of ultraviolet light being used as energy source to polymerize the laminar perovskite compound $CH_3(CH_2)_2C{\equiv}C{-}C{\equiv}CCH_2NH_3)_2PbBr_4$, gamma rays (radiation amount factor 22.3 kGy/h) from $^{60}Co$ were used as energy source.

Figure 6:
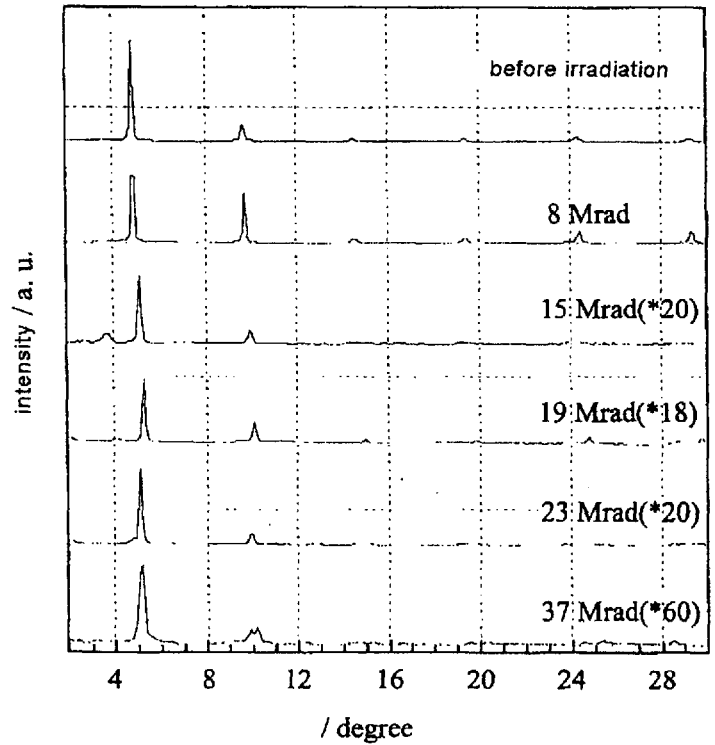
FIG. 6 shows the variation in X-ray diffraction of a spin coat film of $(CH_3(CH_2)_2C{\equiv}C{-}C{\equiv}CCH_2NH_3)_2PbBr_4$ relative to gamma ray irradiation amount.
Figure 7:
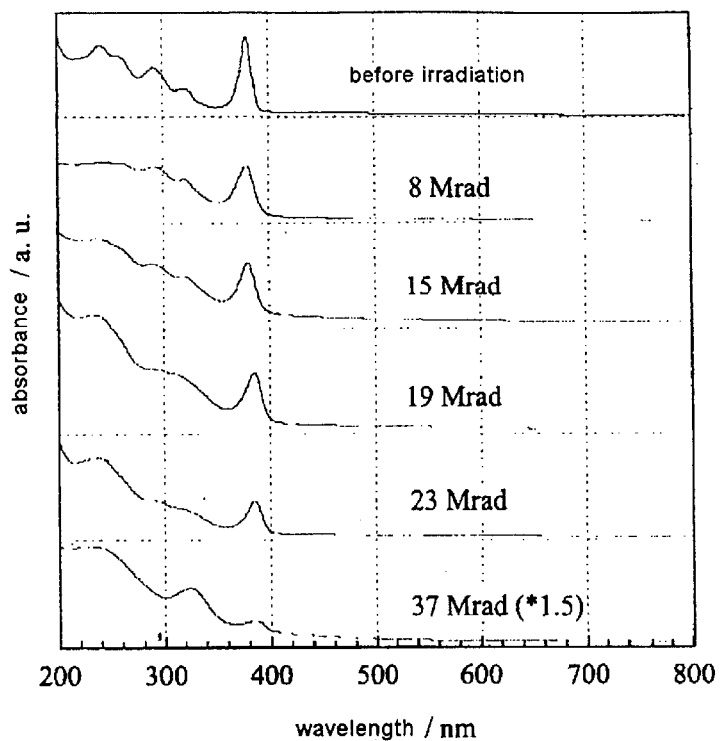
FIG. 7 shows the variation in the absorption spectrum of a spin coat film of $(CH_3(CH_2)_2C{\equiv}C{-}C{\equiv}CCH_2NH_3)_2PbBr_4$ relative to gamma ray irradiation amount.

FIGS. 6–7 show the X-ray diffraction (FIG. 6) and visible UV absorption (FIG. 7) with increase of this gamma radiation amount.

In FIG. 6, it is seen that, as the interlayer distance varies due to irradiation, a polymerization reaction occurs in the laminar perovskite compound and polymerization of the organic layer takes place.

FIG. 7 shows that the exciton absorption is maintained even after polymerization. In other words, it was found that polymerization of the organic diacetylene amine layer occurred as in Example 1.

EXAMPLE 3

A laminar perovskite compound, $(CH_3(CH_2)_{13}C\equiv C-C\equiv CCH_2NH_3)_2PbBr_4$, having an organic layer comprising an amine with a diacetylene bond introduced in the organic layer, was synthesized by reacting lead bromide $PbBr_2$ as metal halide with $(CH_3(CH_2)_{13}C\equiv C-C\equiv CCH_2NH_3Br$ as an organic amine halogenated hydroacid in a molar ratio of 1:2 in N,N-dimethylformamide. The powdered sample thus obtained was dissolved in the organic solvent N,N'-dimethylformamide and spin-coated on a quartz substrate to give a thin film. The powder and thin film were both irradiated by gamma rays (radiation amount factor 22.3 kGy/hr) from $^{60}Co$ in a radiation amount range of 14–27 Mrad.

Figure 8:
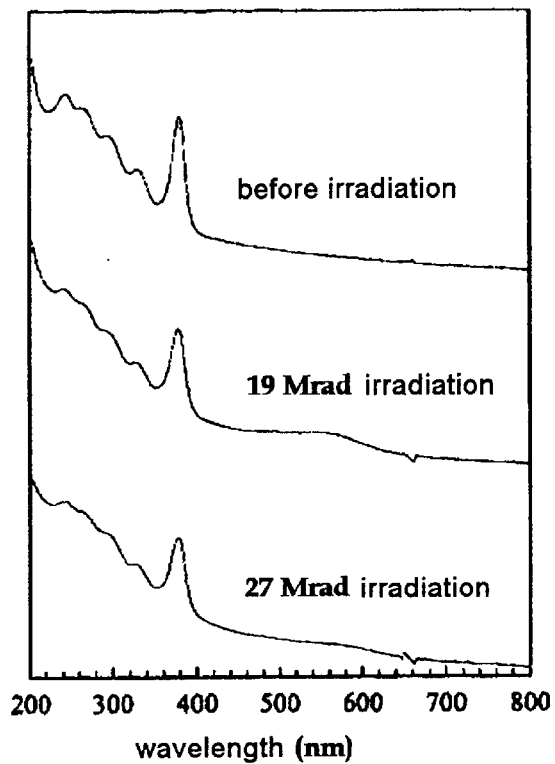
FIG. 8 shows the variation in the absorption spectrum of a spin coat film of $(CH_3(CH_2)_{13}C{\equiv}C{-}C{\equiv}CCH_2NH_3)_2PbBr_4$ relative to gamma ray irradiation amount.
Figure 9:
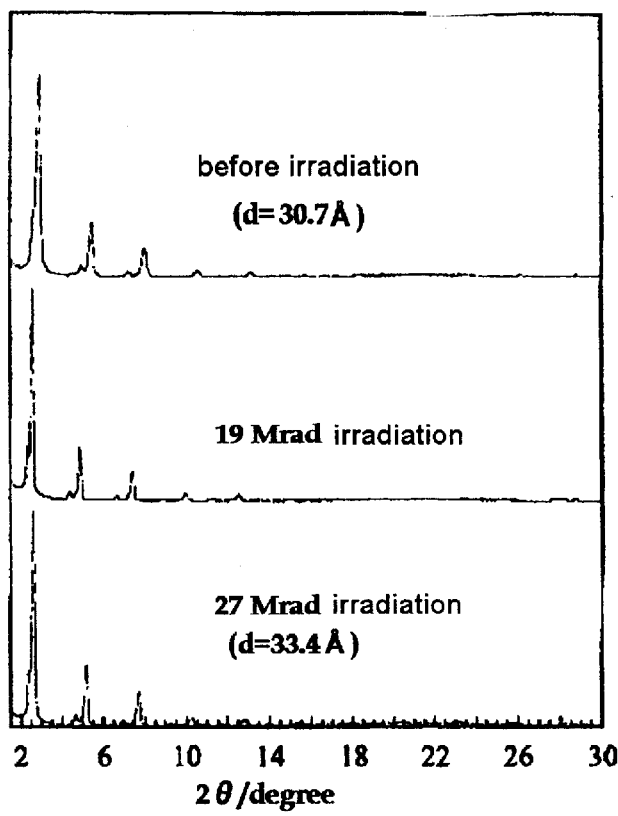
FIG. 9 shows the variation in X-ray diffraction of a spin coat film of $(CH_3(CH_2)_{13}C{\equiv}C{-}C{\equiv}CCH_2NH_3)_2PbBr_4$ relative to gamma ray irradiation amount.

FIG. 8 and FIG. 9 respectively show the variation of visible UV absorption and X-ray diffraction due to the increase of gamma irradiation amount of this spin-coated film. As shown in FIG. 8, the colourless, transparent perovskite thin film prior to irradiation showed an exciton absorption of 378 nm based on the two-dimensional quantum well structure. When it is irradiated by gamma rays at 19 Mrad, the perovskite thin film turns red. In the absorption spectrum at this time, an exciton absorption occurs at 380 nm and an absorption occurs at 550 nm based on a $\pi$–$\pi^*$ transition in the polydiacetylene. This shows that a $\pi$ conjugate system is formed in the organic layer due to polymerization of the diacetylene. From the X-ray diffraction results shown in FIG. 9, it was also clear that the laminar structure was maintained even after polymerization due to gamma ray irradiation, and that the interlayer distance increases. Due to this polymerization, it was possible to manufacture a novel superlattice wherein a $\pi$ conjugation system had been introduced into the organic layer.

Figure 10:
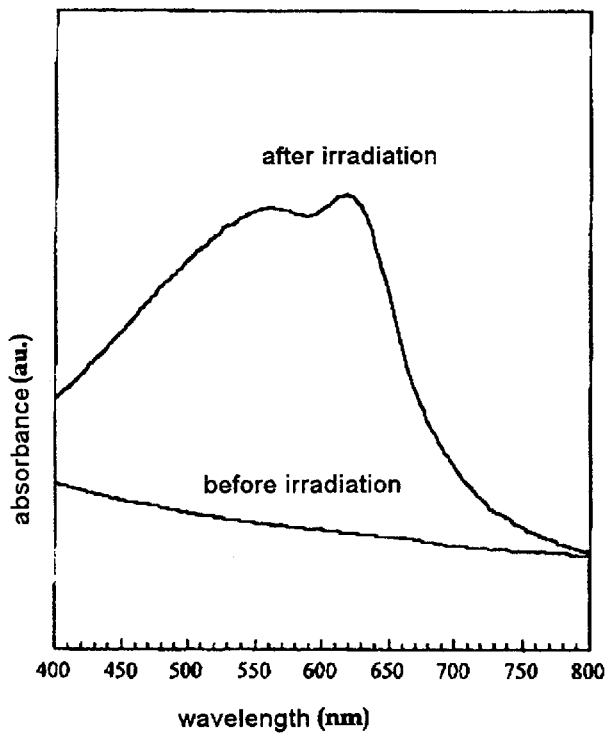
FIG. 10 shows the variation in the absorption spectrum of a $(CH_3(CH_2)_{13}C{\equiv}C{-}C{\equiv}CCH_2NH_3)_2PbBr_4$ powder before and after gamma ray irradiation.

FIG. 10 shows the absorption spectrum obtained by irradiating a powder of the laminar perovskite compound $(CH_3(CH_2)_{13}C\equiv C-C\equiv CCH_2NH_3)_2PbBr_4$ with gamma rays of 19 Mrad, and dispersing the powder obtained before and after irradiation in KBr. In this spectrum, an absorption in the vicinity of 550 nm based on a $\pi$–$\pi^*$ transition in the polymer obtained from the laminar perovskite compound was clearly observed.

EXAMPLE 4

Figure 11:
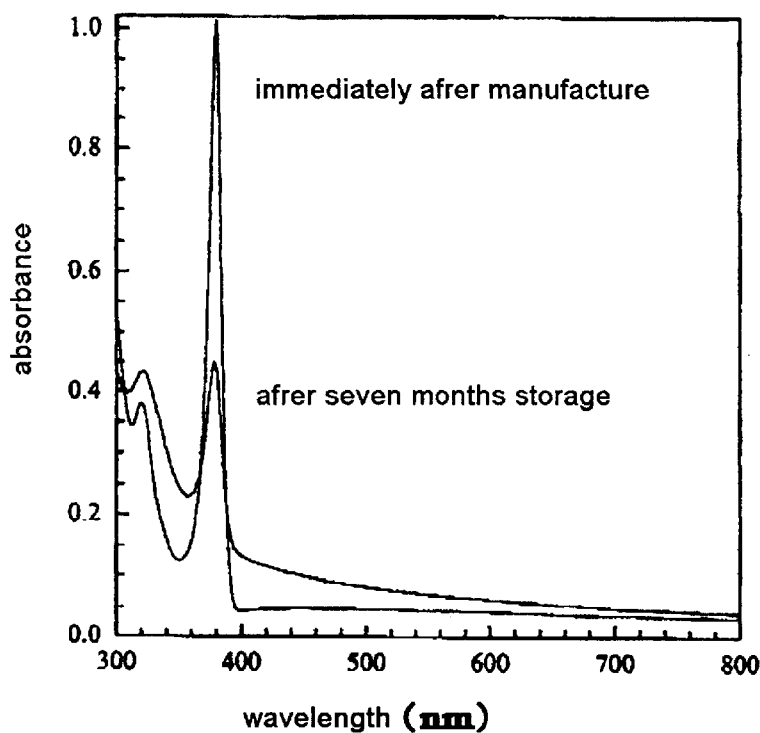
FIG. 11 shows the variation in the absorption spectrum of a gamma ray non-irradiated laminar perovskite compound immediately after manufacture, and after seven months storage.
Figure 12:
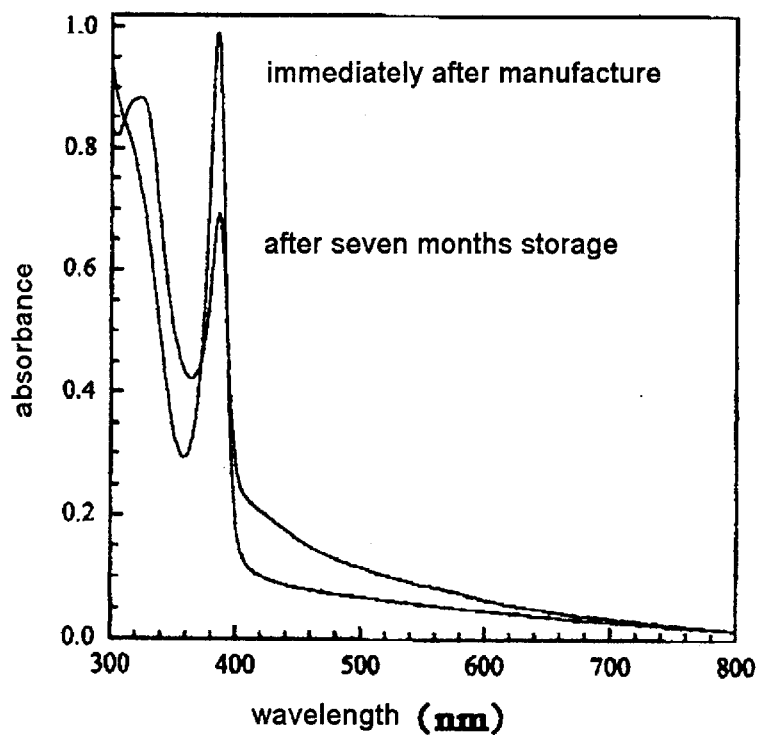
FIG. 12 shows the variation in the absorption spectrum of a gamma ray-irradiated laminar perovskite compound immediately after manufacture, and after seven months storage.

The laminar perovskite compound manufactured in Example 1 (not irradiated with gamma rays) was shielded from light and kept at room temperature for seven months. The absorption spectra immediately after preparing this compound and after seven months storage, were measured. FIG. 11 shows the spectral variation. The laminar perovskite compound was also irradiated with gamma rays of 19 Mrad, shielded from light and kept at room temperature for seven months. The absorption spectra immediately after irradiating this compound and after seven months storage were measured. FIG. 12 shows the spectral variation.

From these spectra, it is seen that whereas the exciton absorption in the vicinity of 380 nm decreases from 1.0 to 0.45 for the laminar perovskite compound which is not polymerized (FIG. 11), the exciton absorption in the vicinity of 380 nm decreases from 1.0 to only 0.69 for the laminar perovskite compound which is polymerized (FIG. 12). This shows that the quantum well structure of the polymerized laminar perovskite compound has been stabilized.

What is claimed is:

1. An organic-inorganic laminar perovskite polymer compound manufactured by cross-linking unsaturated bonds in the organic-inorganic laminar perovskite polymer compound represented by the general formula $(RNH_3)_2MX_4$ (in the formula, R is a hydrocarbon group having an unsaturated bond, X is a halogen atom or a mixture of halogens, and M is a Group IVa metal, Eu, Cd, Cu, Fe, Mn or Pd).

2. The organic-inorganic laminar perovskite polymer compound as defined in claim 1, wherein said unsaturated bond is cross-linked by UV light or radiation.

3. The organic-inorganic laminar perovskite polymer compound as defined in claim 1, wherein R is represented by $CH_3(CH_2)_nC\equiv C-C\equiv CCH_2$ (in the formula, n=2–14), and M is Pb.

4. The organic-inorganic laminar perovskite polymer compound as defined in claim 1, wherein X is a bromine atom.

5. The organic-inorganic laminar perovskite polymer compound as defined in claim 2, wherein R is represented by $CH_3(CH_2)_nC\equiv C-C\equiv CCH_2$ (in the formula, n=2–14), and M is Pb.

6. The organic-inorganic laminar perovskite polymer compound as defined claim 2, wherein X is a bromine atom.

7. The organic-inorganic laminar perovskite polymer compound as defined claim 8, wherein X is a bromine atom.

* * * * *